(12) United States Patent
Xiang et al.

(10) Patent No.: US 7,170,084 B1
(45) Date of Patent: Jan. 30, 2007

(54) STRAINED SILICON MOSFET HAVING IMPROVED SOURCE/DRAIN EXTENSION DOPANT DIFFUSION RESISTANCE AND METHOD FOR ITS FABRICATION

(75) Inventors: Qi Xiang, San Jose, CA (US);
Jung-Suk Goo, Stanford, CA (US);
Haihong Wang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 47 days.

(21) Appl. No.: 10/872,707

(22) Filed: Jun. 21, 2004

Related U.S. Application Data

(62) Division of application No. 10/335,522, filed on Dec. 31, 2002, now Pat. No. 6,756,276.

(60) Provisional application No. 60/415,178, filed on Sep. 30, 2002.

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. .......................... 257/19; 257/18; 257/327; 257/336; 257/344; 257/347; 257/408; 435/230; 435/231; 435/232; 435/514; 435/542

(58) Field of Classification Search ................ 257/336, 257/344, 347, 408, 18–19, 327–328; 438/230–232, 438/514, 542
See application file for complete search history.

(56) References Cited

U.S. PATENT DOCUMENTS

| | | | | |
|---|---|---|---|---|
| 5,536,959 A | * | 7/1996 | Kellam ........................ | 257/327 |
| 5,675,166 A | * | 10/1997 | Ilderem et al. ............. | 257/345 |
| 5,736,446 A | * | 4/1998 | Wu ............................. | 438/305 |
| 5,759,901 A | * | 6/1998 | Loh et al. ................... | 438/305 |
| 5,847,419 A | * | 12/1998 | Imai et al. .................. | 257/192 |
| 5,951,757 A | | 9/1999 | Dubbelday et al. | |
| 6,017,798 A | * | 1/2000 | Ilderem et al. ............. | 438/286 |
| 6,046,472 A | * | 4/2000 | Ahmad et al. ............... | 257/336 |
| 6,078,081 A | * | 6/2000 | Lee ............................. | 257/344 |
| 6,114,211 A | * | 9/2000 | Fulford et al. .............. | 438/305 |
| 6,174,778 B1 | * | 1/2001 | Chen et al. ................. | 438/302 |
| 6,268,640 B1 | * | 7/2001 | Park et al. ................... | 257/607 |
| 6,274,906 B1 | * | 8/2001 | Kim et al. ................... | 257/336 |

(Continued)

*Primary Examiner*—Ida M. Soward
(74) *Attorney, Agent, or Firm*—Foley & Lardner LLP

(57) ABSTRACT

An n-type MOSFET (NMOS) is implemented on a substrate having an epitaxial layer of strained silicon formed on a layer of silicon germanium. The MOSFET includes first halo regions formed in the strained silicon layer that extent toward the channel region beyond the ends of shallow source and drain extensions. Second halo regions formed in the underlying silicon germanium layer extend toward the channel region beyond the ends of the shallow source and drain extensions and extend deeper into the silicon germanium layer than the shallow source and drain extensions. The p-type dopant of the first and second halo regions slows the high rate of diffusion of the n-type dopant of the shallow source and drain extensions through the silicon germanium toward the channel region. By counteracting the increased diffusion rate of the n-type dopant in this manner, the shallow source and drain extension profiles are maintained and the risk of degradation by short channel effects is reduced.

10 Claims, 4 Drawing Sheets

U.S. PATENT DOCUMENTS

| | | | |
|---|---|---|---|
| 6,452,236 B1 * | 9/2002 | Nadakumar et al. | 257/356 |
| 6,492,216 B1 * | 12/2002 | Yeo et al. | 438/197 |
| 6,509,241 B2 * | 1/2003 | Park et al. | 438/303 |
| 6,555,437 B1 * | 4/2003 | Yu | 438/300 |
| 6,555,880 B2 | 4/2003 | Cabral, Jr. et al. | |
| 6,593,641 B1 | 7/2003 | Fitzergald | |
| 6,600,170 B1 | 7/2003 | Xiang | |
| 6,630,385 B1 * | 10/2003 | Yu | 438/289 |
| 6,633,066 B1 | 10/2003 | Bae et al. | |
| 6,657,223 B1 | 12/2003 | Wang et al. | |
| 6,689,671 B1 | 2/2004 | Yu et al. | |
| 6,690,060 B2 * | 2/2004 | Horiuchi et al. | 257/327 |
| 6,765,227 B1 * | 7/2004 | Yu et al. | 257/19 |
| 6,881,632 B2 * | 4/2005 | Fitzgerald et al. | 438/285 |
| 6,882,013 B2 * | 4/2005 | Nandakumar | 257/368 |
| 6,909,144 B2 * | 6/2005 | Kuwazawa | 257/336 |
| 6,914,301 B2 * | 7/2005 | Bae et al. | 257/347 |
| 2001/0012672 A1 * | 8/2001 | Dennison et al. | 438/306 |
| 2002/0008289 A1 * | 1/2002 | Murota et al. | 257/369 |
| 2002/0024106 A1 * | 2/2002 | Ootsuka et al. | 257/393 |
| 2002/0185691 A1 * | 12/2002 | Cabral et al. | 257/384 |
| 2002/0197806 A1 * | 12/2002 | Furukawa et al. | 438/305 |
| 2003/0030091 A1 * | 2/2003 | Bulsara et al. | 257/301 |
| 2003/0234439 A1 * | 12/2003 | Currie et al. | 257/616 |

* cited by examiner

STRAINED SILICON MOSFET HAVING IMPROVED SOURCE/DRAIN EXTENSION DOPANT DIFFUSION RESISTANCE AND METHOD FOR ITS FABRICATION

BACKGROUND OF THE INVENTION

1. Field of the Invention

The present invention relates generally to fabrication of metal oxide semiconductor field effect transistors (MOSFETs), and more particularly, to MOSFETs that achieve improved carrier mobility through the incorporation of strained silicon.

2. Related Technology

MOSFETs are a common component of integrated circuits (ICs). FIG. 1 shows a conventional MOSFET device. The MOSFET is fabricated on a semiconductor substrate 10 within an active area bounded by shallow trench isolations 12 that electrically isolate the active areas of the MOSFET from other IC components fabricated on the substrate 10.

The MOSFET is comprised of a gate electrode 14 that is separated from a channel region 16 in the substrate 10 by a thin gate insulator 18 such as silicon oxide or oxide-nitride-oxide (ONO). To minimize the resistance of the gate 14, the gate 14 is typically formed of a doped semiconductor material such as polysilicon.

The source and drain of the MOSFET are provided as deep source and drain regions 20 formed on opposing sides of the gate 14. Source and drain silicides 22 are formed on the source and drain regions 20 and are comprised of a compound that combines the substrate semiconductor material and a metal such as cobalt (Co) or nickel (Ni) to reduce contact resistance to the source and drain regions 20. The deep source and drain regions 20 are formed deeply enough to extend beyond the depth to which the source and drain silicides 22 are formed. The deep source and drain regions 20 are implanted subsequent to the formation of spacers 30 around the gate and gate insulator which serve as an implantation mask to define the lateral position of the deep source and drain regions 20 relative to the channel region 16 beneath the gate.

The gate 14 likewise has a silicide 24 formed on its upper surface. The gate structure comprising a polysilicon material and an overlying silicide is sometimes referred to as a polycide gate.

The source and drain of the MOSFET further comprise shallow source and drain extensions 26. As dimensions of the MOSFET are reduced, short channel effects resulting from the small distance between the source and drain cause degradation of MOSFET performance. The use of shallow source and drain extensions 26 rather than deep source and drain regions near the ends of the channel 18 helps to reduce short channel effects. The source and drain extensions are implanted prior to the formation of the gate spacers 30 and the gate 14 acts as an implantation mask to define the lateral position of the source and drain extensions 26 relative to the channel region 18. Diffusion during subsequent annealing causes the source and drain extensions 26 to extend slightly beneath the gate 14.

Implanted adjacent to the shallow source and drain extensions 26 are so-called "halo" regions 28. The combination of shallow source and drain extensions and halo regions is sometimes referred to as a double-implanted shallow source and drain extension. The halo regions 28 are implanted with a dopant that is opposite in conductivity type to the dopant of the source and drain extensions 26. For example, when the source and drain extensions are implanted with an n-type dopant such as arsenic (As) or phosphorous (P), the halo regions are implanted with a p-type dopant such as boron (B). The halo regions help to suppress a short channel effect known as punchthrough, which occurs when the channel length of the device is sufficiently short that the depletion regions at the ends of the source and drain extensions to overlap, thus effectively merging the two depletion regions. Any increase in reverse-bias drain voltage beyond that required to establish punchthrough lowers the potential energy barrier for majority carriers in the source, resulting in a punchthrough current between the source and drain that must be suppressed for proper device operation. The presence of the halo regions 28 shortens the depletion regions at the ends of the source and drain extensions 26 and thus allows the fabrication of MOSFETs having shorter channel regions while avoiding punchthrough. The halo regions 28 may be formed by low energy implantation of dopant at an angle to the substrate so as to ensure that the halo regions extend beyond the ends of the source and drain extensions 26.

One recent area of investigation for improvement of the conventional MOSFET is the incorporation of "strained" silicon in the semiconductor substrate. Strained silicon is a form of silicon in which a tensile strain is applied to the silicon lattice as a result of the difference in the dimensionalities of the silicon lattice and the lattice of the underlying material on which it is formed. In the illustrated case, the silicon germanium lattice is more widely spaced than a pure silicon lattice, with the spacing becoming wider as the percentage of germanium increases. Because the silicon lattice aligns with the larger silicon germanium lattice during formation, a tensile strain is imparted to the silicon layer. In essence, the silicon atoms are pulled apart from one another. Relaxed silicon has a conductive band that contains six equal valence bands. The application of tensile strain to the silicon causes four of the six valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons meet with less vibrational energy from the nucleus of the silicon atom, which causes them to scatter at a rate of 500 to 1000 times less than in relaxed silicon. Consequently, carrier mobility is dramatically increased in strained silicon compared to relaxed silicon, providing a potential increase in mobility of 80% or more for electrons and 20% or more for holes. The increase in mobility has been found to persist for current fields up to 1.5 megavolts/centimeter. These factors are believed to enable a device speed increase of 35% without further reduction of device size, or a 25% reduction in power consumption without a reduction in performance.

FIG. 2 shows an example of an N-type MOSFET (NMOS) incorporating strained silicon and formed in accordance with the conventional processing used to form the MOSFET of FIG. 1. The MOSFET of FIG. 2 differs from the MOSFET of FIG. 1 in that it is formed on a silicon germanium substrate 34 over which is formed an epitaxial layer of strained silicon 36. The upper portions of the channel region 18 and the source and drain regions 20 are formed in the strained silicon layer 36. The thickness of the strained silicon layer 36 is less than the depth of the shallow source and drain extensions 26.

The arsenic dopant of the NMOS shallow source and drain extensions 26 and deep source and drain regions 20 diffuses at a greater rate in silicon germanium than in silicon, and as a result, during processing such as rapid thermal annealing (RTA) to activate the implanted dopants, the growth of the shallow source and drain extensions 26 and the deep source and drain regions 20 is greater in the silicon germanium substrate 34 than in the strained silicon layer 36. As a result, the shallow source and drain extensions 26 develop distorted outgrowths 38 that effectively shorten the channel length in the silicon germanium layer 34 and increase the risk of punchthrough and other short channel effects.

Therefore the n-type strained silicon MOSFET formed in accordance with the conventional processing used to form an NMOS on a relaxed silicon substrate suffers from degraded short channel effect resistance compared to the conventional MOSFET.

SUMMARY OF THE INVENTION

It is an object of the present invention to provide the enhancements of strained silicon in a conventional NMOS device without significantly degrading the resistance of the device to short channel effects.

In accordance with embodiments of the invention, a strained silicon NMOS utilizes first p-type halo regions formed in the strained silicon layer that extend beyond the ends of shallow source and drain extensions. Second p-type halo regions formed in the underlying silicon germanium layer extend beyond the ends of the shallow source and drain extensions and extend deeper into the silicon germanium layer than the shallow source and drain extensions. The dopant of the first and second halo regions slows the rate of diffusion of the arsenic dopant of the NMOS shallow source and drain extensions toward the channel region. By counteracting the increased diffusion rate of arsenic in this manner, the shallow drain extension profiles are maintained and the risk of degradation by short channel effects is reduced.

In accordance with one embodiment of the invention, a MOSFET is formed. Initially a substrate is provided. The substrate comprises a layer of silicon germanium having a layer of strained silicon formed thereon, and having a gate insulator formed on the strained silicon layer and a gate formed on the gate insulator. A first halo implantation is then performed. The first halo implantation uses a p-type dopant to form first halo regions in the strained silicon layer at opposing sides of the gate. The first halo regions extend toward a channel region of the MOSFET beyond the ends of shallow source and drain extensions that will be formed subsequently. A second halo implantation is then performed. The second halo implantation uses the p-type dopant to form second halo regions in the silicon germanium layer at said opposing sides of the gate. The second halo regions extend toward the channel region of the MOSFET beyond ends of the shallow source and drain extensions to be formed in subsequent processing. The second halo regions further extend into the silicon germanium layer beyond a depth of the shallow source and drain extensions to be formed in subsequent processing. The shallow source and drain extensions are then implanted within the first and second halo regions using an n-type dopant. Deep source and drain regions are then implanted using an n-type dopant. Annealing is then performed to activate the implanted dopants. After annealing, the shallow source and drain extensions do not extend beyond the first and second halo regions.

In accordance with another embodiment of the invention, an n-type MOSFET comprises a substrate that includes a layer of silicon germanium having a layer of strained silicon formed thereon. A gate insulator is formed on the strained silicon layer and a gate is formed on the gate insulator. Deep n-type source and drain regions are formed in the substrate on opposing sides of the gate, and shallow n-type source and drain extensions are formed in the strained silicon layer and the silicon germanium layer and extend from the deep source and drain regions toward a channel region of the MOSFET. First p-type halo regions are formed in the strained silicon layer. The first halo regions extend toward the channel region of the MOSFET beyond the ends of the shallow source and drain extensions. Second p-type halo regions are formed in the silicon germanium layer. The second halo regions extend toward the channel region of the MOSFET beyond the ends of the shallow source and drain extensions, and extend into the silicon germanium layer beyond the depth of the shallow source and drain extensions.

DESCRIPTION OF THE DRAWINGS

Embodiments of the invention are described in conjunction with the following drawings, in which:

FIG. 3b shows implantation of a second halo region into the structure of FIG. 3a;

DETAILED DESCRIPTION OF PREFERRED EMBODIMENTS

Figure 1:
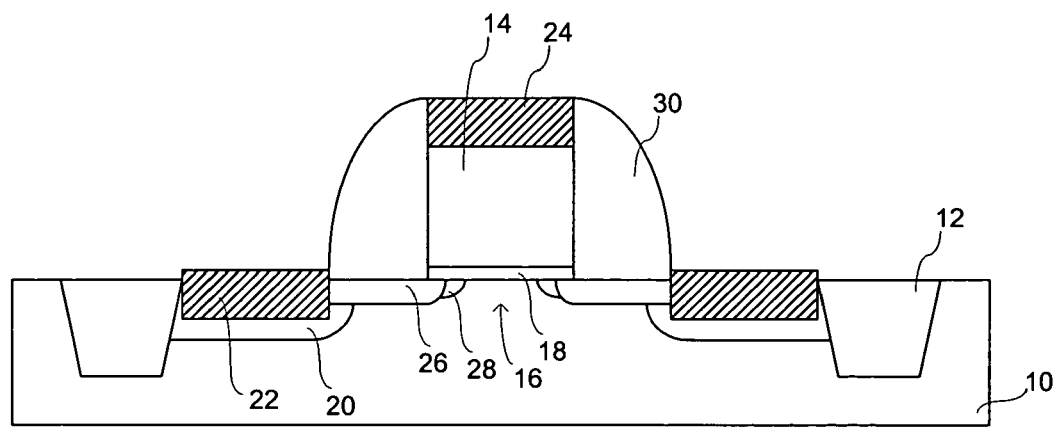
FIG. 1 shows a conventional MOSFET formed in accordance with conventional processing.
Figure 2:
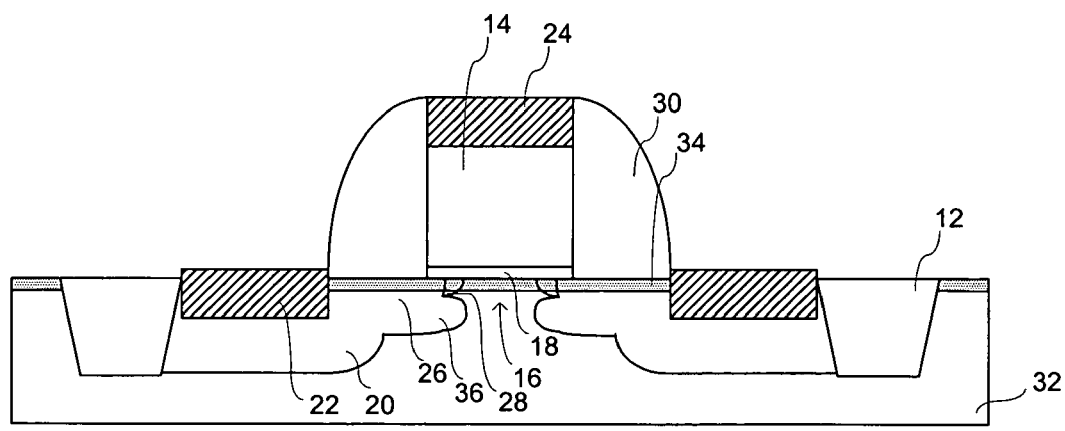
FIG. 2 shows a strained silicon NMOS device formed in accordance with the conventional processing used to form the MOSFET of FIG. 1.
Figure 3A:
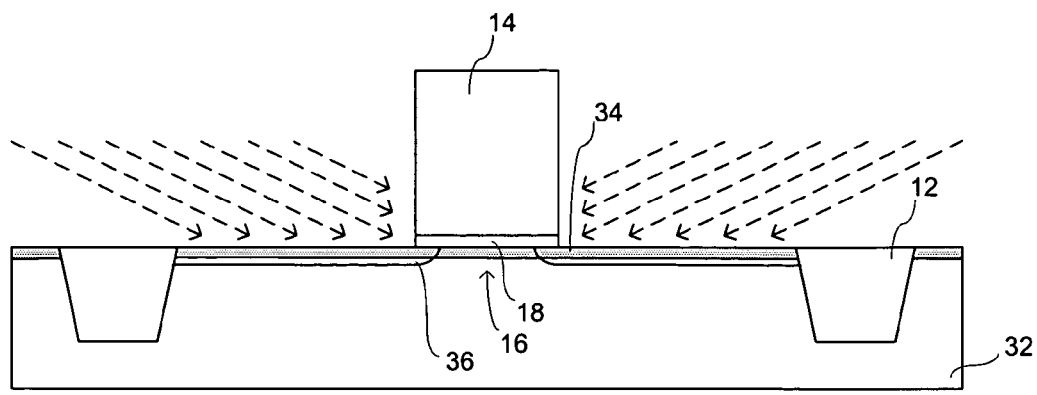
FIG. 3a shows implantation of a first halo region in a substrate comprising a silicon germanium layer and an epitaxial strained silicon layer.

FIGS. 3a–3f show structures formed during fabrication of a strained silicon NMOS in accordance with a preferred embodiment of the invention. FIG. 3a shows a structure comprising a layer of silicon germanium 32 having an epitaxial layer of strained silicon 34 formed on its surface. The silicon germanium layer 32 preferably has a composition $Si_{1-x}Ge_x$, where x is approximately 0.2, and is more generally in the range of 0.1 to 0.3. The silicon germanium layer 32 typically comprises a silicon germanium layer grown on a silicon wafer. Silicon germanium may be grown, for example, by chemical vapor deposition using $Si_2H_6$ (disilane) and $GeH_4$ (germane) as source gases, with a substrate temperature of 600–900 degrees C., a $Si_2H_6$ partial pressure of 30 mPa, and a $GeH_4$ partial pressure of 60 mPa. Growth of the silicon germanium material may be initiated using these ratios, or alternatively the partial pressure of $GeH_4$ may be gradually increased beginning from a lower pressure or zero pressure to form a gradient composition. The thickness of the silicon germanium layer may be determined in accordance with the particular application. The upper portion of the silicon germanium substrate 32 on which the strained silicon is grown should have a uniform composition.

The strained silicon layer is preferably grown by chemical vapor deposition (CVD) using $Si_2H_6$ as a source gas with a partial pressure of 30 mPa and a substrate temperature of approximately 600–900 degrees C. The strained silicon layer is preferably grown to a thickness of approximately 200 Angstroms.

As shown in FIG. 3a, a first halo implantation of a p-type dopant is performed using a low energy at a small angle relative to the substrate surface to form first halo regions 36. The angle and energy of implantation are chosen such that the first halo regions extend into the channel region 16 to a point that is beyond the desired termination point of a shallow source and drain extensions that will be formed in later processing. The first halo regions 36 are formed in the strained silicon layer 34 at opposing sides of the gate 14 and may extend into the underlying silicon germanium layer 32. The p-type dopant is preferably boron (B) but may alternatively be $BF_2$ or another p-type dopant.

Figure 3B:
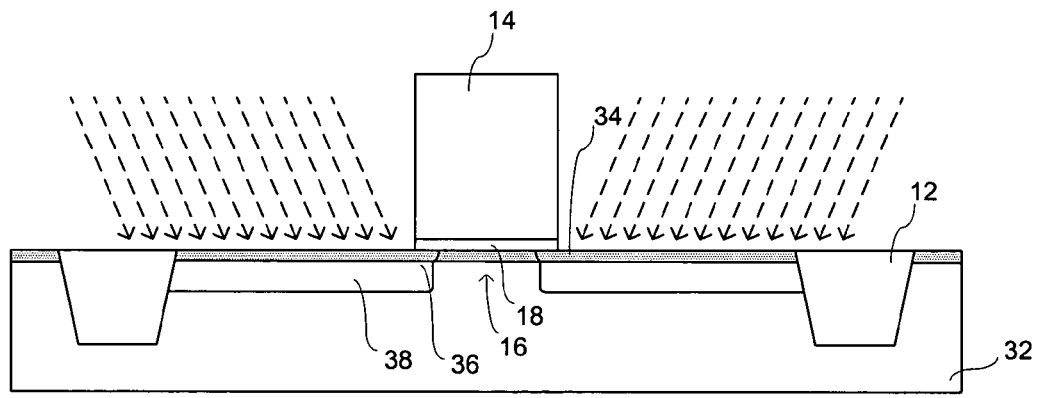

FIG. 3b shows the structure of FIG. 3a during a second halo implantation of a p-type dopant to form second halo regions 38. The second halo regions 38 are implanted using a high energy at a large angle relative to the surface of the substrate. The angle and energy of implantation are chosen such that the second halo regions extend into the channel region 16 to a point that is beyond the desired termination point of the shallow source and drain extensions to be formed during later processing, and such that the second halo regions extend into the silicon germanium layer 32 to a depth that is deeper than the desired depth of the shallow source and drain extensions to be formed later. The angle of implantation used for the second halo regions allows dopant to be implanted to a greater depth than the first halo regions while still extending approximately the same distance toward the channel region 16 as the first halo regions. Accordingly, the angle of implantation of the second halo region 38 is typically greater than that of the first halo region 36 but less than that of the implantation used later to form the shallow source and drain extensions. The p-type dopant of the second halo region is preferably boron but may be $BF_2$ or another p-type dopant.

Figure 3C:
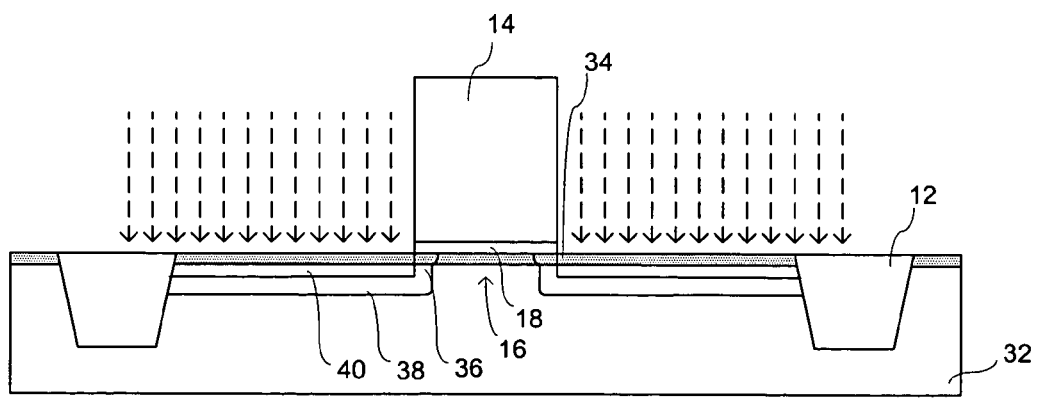
FIG. 3c shows implantation of shallow source and drain extensions into the structure of FIG. 3b.

FIG. 3c shows the structure of FIG. 3b during implantation of arsenic to form shallow source and drain extensions 40. The source and drain extensions 40 are implanted at a larger angle to the surface than was used for implantation of the second halo regions 38, and at an energy such that the source and drain extensions 40 are less deep than the second halo regions 38.

Figure 3D:
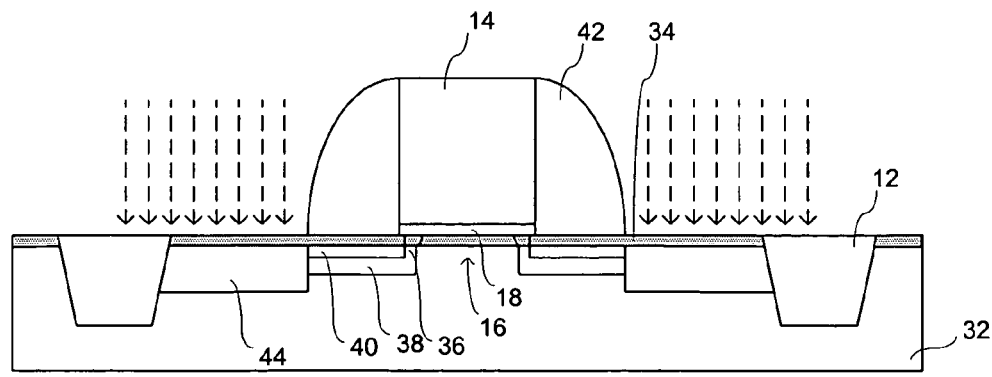
FIG. 3d shows implantation of deep source and drain regions into the structure of FIG. 3c.

FIG. 3d shows the structure of FIG. 3c after formation of a spacer 42 around the gate 14 and gate insulator 18. The spacer serves as an implantation mask for implantation of arsenic to form deep source and drain regions 44. The deep source and drain regions 44 are implanted to a depth that is greater than the anticipated depth of silicide contacts to be formed in further processing.

Figure 3E:
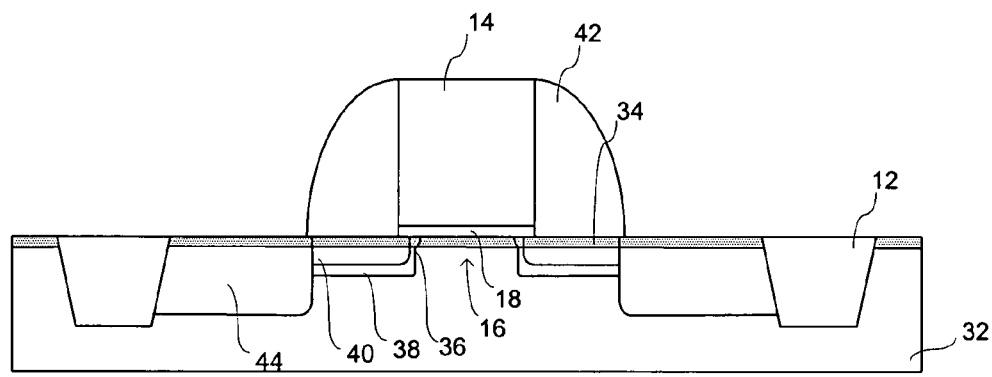
FIG. 3e shows the structure of FIG. 3d after annealing.

FIG. 3e shows the structure of FIG. 3d after performing rapid thermal annealing (RTA) to anneal the strained silicon layer 34 and silicon germanium substrate 32 and to activate the dopants implanted in the first and second halo regions 36, 38, the shallow source and drain extensions 40 and the deep source and drain regions 44. During annealing the implanted dopants diffuse through the strained silicon 34 and the silicon germanium 32. However, the p-type dopants of the first and second halo regions 36, 38 restrict the rate of diffusion of the arsenic dopant of the shallow source and drain extensions 40, and as seen by comparison of FIGS. 3d and 3e, the arsenic dopant of the shallow source and drain extensions 40 diffuses, but the source and drain extensions 40 do not extend beyond the first and second halo regions 36, 38. Therefore the problem associated with deep and distorted source and drain extensions are reduced.

Figure 3F:
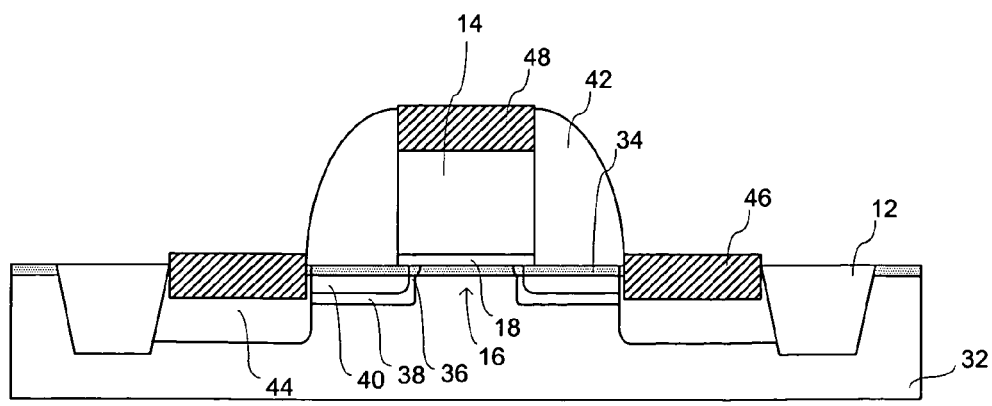
FIG. 3f shows the structure of FIG. 3e after formation of silicide contacts on the source and drain regions and gate.

FIG. 3f shows the structure of FIG. 3e after formation of silicide contacts 46 on the source and drain regions 44 and a silicide contact 48 on the gate 14. The silicide contacts are formed of a compound comprised of a semiconductor material and a metal. Typically a metal such as cobalt (Co) is used, however other metals such as nickel (Ni) may also be employed. The silicide contacts are formed by depositing a thin conformal layer of the metal over the substrate, and then annealing to promote silicide formation at the points of contact between the metal and underlying semiconductor materials.

In view of the foregoing description, it will be appreciated that certain parameters of halo region formation, such as the angles of implantation, the energies of implantation, and the implantation doses, are dependent upon the characteristics of the shallow source and drain extensions that the halos are intended to surround. Typically it is desirable to minimize the amount of halo dopant used so that the conductivities of the source/drain region and channel region materials of the MOSFET are not significantly affected. In an illustrative embodiment, shallow source and drain extensions are implanted with arsenic using a dose of about $1\times10^{14}$ to $1\times10^{15}$ $cm^{-2}$, and the halo regions are implanted with boron using a dose of about $1\times10^{13}$ to $5\times10^{13}$ $cm^{-2}$.

While the processing shown in FIGS. 3a–3f represents a presently preferred embodiment, a variety of alternatives may be implemented. For example, the embodiment of FIGS. 3a–3f is implemented in a conventional semiconductor substrate construction in which active regions of MOSFETs are isolated at their edges by shallow trench isolations, and are isolated within the substrate by junctions created between the active device regions and the material of the substrate. However, alternative embodiments of the invention may be applied to silicon on insulator (SOI) constructions in which a device such as a MOSFET is comprised of a monolithic semiconductor body that is formed on an insulating layer such as an oxide layer that isolates the MOSFET from other devices fabricated on the same substrate. In such embodiments a similar series of processing tasks including implantation of halo regions followed by implantation of shallow source and drain extensions and deep source and drain regions may be performed.

Accordingly a variety of embodiments in accordance with the invention may be implemented. In general terms, such embodiments include n-type shallow source and drain extensions formed in a strained silicon layer and a silicon germanium layer. First p-type halo regions formed in the strained silicon layer extend toward a channel region beyond the ends of the shallow source and drain extensions, and second p-type halo regions formed in the silicon germanium layer extend toward the channel region beyond the ends of the shallow source and drain extensions, and extend into the silicon germanium layer beyond the depth of the shallow source and drain extensions.

Figure 4:
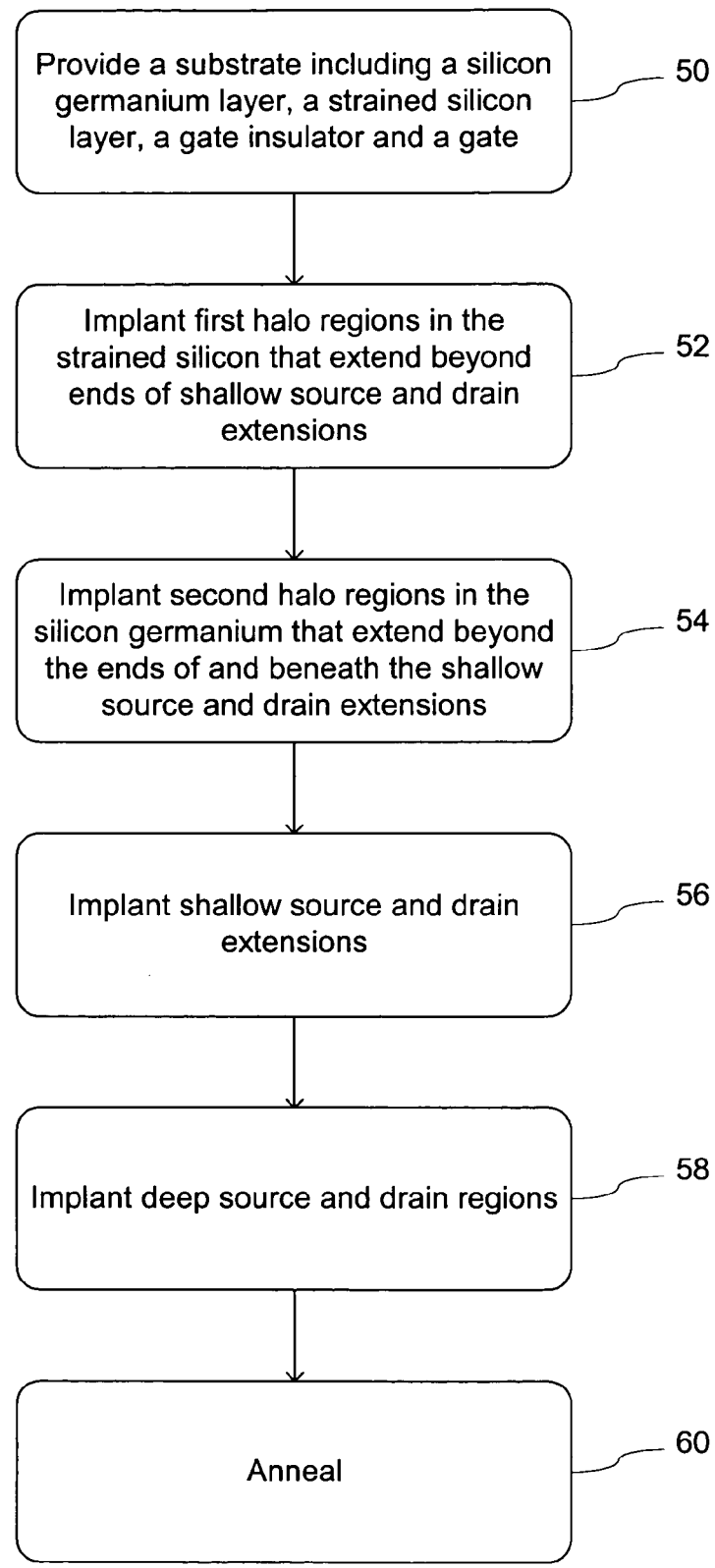
FIG. 4 shows a process flow encompassing the embodiment of FIGS. 3a–3f and alternative embodiments.

FIG. 4 shows a process flow encompassing the preferred embodiment of FIGS. 3a–3f, the aforementioned alternatives and other alternatives. Initially a substrate is provided (50). The substrate comprises a layer of silicon germanium having a layer of strained silicon formed thereon, and having a gate insulator formed on the strained silicon layer and a gate formed on the gate insulator. A first halo implantation is then performed (52). The first halo implantation uses a p-type dopant to form first halo regions in the strained silicon layer at opposing sides of the gate. The first halo regions extend toward a channel region of the MOSFET beyond the ends of shallow source and drain extensions that will be formed subsequently. A second halo implantation is then performed (54). The second halo implantation uses the p-type dopant to form second halo regions in the silicon germanium layer at said opposing sides of the gate. The second halo regions extend toward the channel region of the MOSFET beyond ends of the shallow source and drain extensions to be formed in subsequent processing. The second halo regions further extend into the silicon germanium layer beyond a depth of the shallow source and drain extensions to be formed in subsequent processing.

Shallow source and drain extensions are then implanted within the first and second halo regions using an n-type dopant (56). Deep source and drain regions are then implanted using an n-type dopant (58). Annealing is then performed to activate the implanted dopants (60). After annealing, the shallow source and drain extensions do not extend beyond the first and second halo regions.

In further embodiments it may be desirable to perform further types of processing. In one embodiment, it may be preferable to implant dopants through a screening layer formed over the gate and substrate to prevent backsputter of germanium which can cause processing equipment contamination. The screening layer may comprise a bi-layer including a lower silicon oxide layer and an upper silicon carbide layer. The screening layer may alternatively comprise a lower silicon oxide layer and an upper metal nitride layer such as TaN, TiN, WN, or Ti/TiN. The screening layer may be left in place during subsequent annealing to further prevent germanium outgassing. In other alternative embodiments, the second halo or a third halo may be implanted with sufficient energy to exceed the depth of the deep source and drain regions and therefore contain the deep source a drain regions at their lateral inward boundaries and at their lower boundaries.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. An n-type metal oxide semiconductor field effect transistor (MOSFET) device, comprising:
   a substrate comprising a layer of silicon germanium having a layer of strained silicon formed thereon;
   a gate insulator formed on the strained silicon layer;
   a gate formed on the gate insulator;
   deep source and drain regions formed in the substrate on opposing sides of the gate;
   shallow source and drain extensions formed in the strained silicon layer and the silicon germanium layer and extending from the deep source and drain regions toward a channel region of the MOSFET;
   a first pair of halo regions formed in the strained silicon layer; and
   a second pair of halo regions formed in the silicon germanium layer,
   the first halo regions and the second halo regions extending toward the channel region of the MOSFET beyond ends of the shallow source and drain extensions,
   the first halo regions extending further toward the channel region than the second halo regions,
   the second halo regions extending into the silicon germanium layer beyond a depth of said shallow source and drain extensions,
   the second halo regions extending deeper into the substrate than the first halo regions,
   the first halo regions extending into the silicon germanium layer, and the second halo regions extending further into the silicon germanium layer than the first halo regions,
   the first and second halo regions comprising p-type dopant and the shallow source and drain extensions comprising an n-type dopant.

2. The device claimed in claim 1, wherein said first halo regions extend under said gate insulator.

3. The device claimed in claim 1, wherein the dopant of the shallow source and drain extensions is arsenic.

4. The device claimed in claim 1, further comprising a spacer formed around the gate and gate insulator.

5. The device claimed in claim 1, wherein the silicon germanium layer has a composition $Si_{1-x}Ge_x$, where x is in the range of 0.1 to 0.3.

6. The device claimed in claim 5, wherein x is approximately 0.2.

7. The device claimed in claim 1, further comprising silicide contacts formed on the deep source and drain regions and on the gate.

8. The device claimed in claim 1, wherein the gate is polysilicon.

9. The device claimed in claim 1, wherein the gate insulator is silicon oxide.

10. The device claimed in claim 1, wherein the silicon germanium layer of the substrate is formed over an insulating layer.

* * * * *